(12) United States Patent
Kirk et al.

(10) Patent No.: US 9,245,664 B2
(45) Date of Patent: Jan. 26, 2016

(54) CONDUCTIVE METAL INK

(75) Inventors: Daniel Kirk, Oxford (GB); Dave Hui, Bristol (GB); Martin Sweet, Bristol (GB)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 684 days.

(21) Appl. No.: 13/463,927

(22) Filed: May 4, 2012

(65) Prior Publication Data

US 2013/0142963 A1 Jun. 6, 2013

Related U.S. Application Data

(60) Provisional application No. 61/566,174, filed on Dec. 2, 2011.

(51) Int. Cl.

| | |
|---|---|
| *H01B 1/22* | (2006.01) |
| *B05D 5/12* | (2006.01) |
| *C09D 5/24* | (2006.01) |
| *C09D 11/52* | (2014.01) |
| *H05K 1/09* | (2006.01) |
| *C08K 3/08* | (2006.01) |
| *C09D 11/037* | (2014.01) |
| *H05K 3/12* | (2006.01) |

(52) U.S. Cl.
CPC .. *H01B 1/22* (2013.01); *B05D 5/12* (2013.01); *C08K 3/08* (2013.01); *C09D 5/24* (2013.01); *C09D 11/037* (2013.01); *C09D 11/52* (2013.01); *H05K 1/097* (2013.01); *C08K 2201/005* (2013.01); *H05K 3/1283* (2013.01)

(58) Field of Classification Search
CPC .............. H01B 1/00; H01B 1/16; H01B 1/22; B05D 5/12; C03C 14/006; C09D 5/24
USPC .......................................................... 252/514
See application file for complete search history.

(56) References Cited

U.S. PATENT DOCUMENTS

| | | | | |
|---|---|---|---|---|
| 2008/0153973 | A1* | 6/2008 | Ittel et al. ...................... | 524/555 |
| 2008/0246007 | A1* | 10/2008 | Gellrich ......................... | 252/500 |
| 2010/0065790 | A1* | 3/2010 | Dietz et al. .................... | 252/514 |

FOREIGN PATENT DOCUMENTS

| | | | |
|---|---|---|---|
| CN | 101262957 | A | 9/2008 |
| CN | 101697292 | A | 4/2010 |
| DE | 3804831 | * | 7/1989 |
| EP | 0916711 | A2 | 5/1999 |
| EP | 1586604 | A1 | 10/2005 |
| JP | 2005-166322 | * | 6/2005 |
| KR | 20100029652 | A | 3/2010 |

OTHER PUBLICATIONS

English language translation of KR10-2010-0029652 (pub date Mar. 2010).*
Search Report.
Database WPI Week 201102, Thomson Scientific, London, GB; AN 2010-L87367 XP002682811, Mar. 17, 2010 cited in the application—abstract.
Database WPI Week 201033, Thomson Scientific, London, GB; AN 2010-E80727 XP002682812, & CN 101 697 292 A (IRICO GROUP CO LTD) Apr. 21, 2010—abstract.
Application No. 201280058062.7—Office Action dated May 6, 2015.

* cited by examiner

*Primary Examiner* — Mark Kopec

(57) ABSTRACT

A conductive metal composition comprising 50 to 94 wt % of silver particles having an average particle size in the range of 40 to 450 nm and having an aspect ratio of 3 to 1:1, 1 to 4 wt % of a thermoplastic polyester resin having a weight-average molar mass of 10000 to 150000, and 4 to 49 wt % of a diluent for the thermoplastic polyester resin.

15 Claims, No Drawings

CONDUCTIVE METAL INK

FIELD OF THE INVENTION

The present invention is directed to a conductive metal composition.

BACKGROUND OF THE INVENTION

KR20100029652A discloses a low-temperature dryable conductive paste comprising 60 to 90 wt % (weight-%) flake type silver powder, and 10 to 40 wt % of a polyester binder resin. The flake type silver powder has a particle size distribution in the range of 1-10 μm or it may be present as a mixture with flake type silver powder having a particle size distribution in the range of 100 to 500 nm. The 10 to 40 wt % polyester binder resin are composed of 5 to 20 wt % polyester resin solid and 5 to 35 wt % diluent.

SUMMARY OF THE INVENTION

The invention relates to a conductive metal composition which includes 50 to 94 wt % of silver particles having an average particle size in the range of 40 to 450 nm and having an aspect ratio of 3 to 1:1, 1 to 4 wt % of a thermoplastic polyester resin having a weight-average molar mass of 10000 to 150000, and 4 to 49 wt % of a diluent for the thermoplastic polyester resin.

DETAILED DESCRIPTION OF INVENTION

In the description and the claims the term "average particle size" is used. It shall mean the average primary particle size (mean particle diameter, d50) determined by means of laser light scattering. Laser light scattering measurements can be carried out making use of a particle size analyzer, for example, a Microtrac S3500 machine.

In the description and the claims the term "aspect ratio" is used with regard to the shape of the silver particles included in the conductive metal composition of the invention. It means the ratio of the largest dimension to the smallest dimension of a silver particle and it is determined by electron microscopy and evaluating the electron microscopical images by measuring the dimensions of a statistically meaningful number of individual silver particles.

With the conductive metal composition of the invention the applicant has found an improved conductive metal composition in terms of low resistivity and good adhesion of a conductive metallization applied therefrom on a substrate and dried under mild drying conditions at a low object temperature in the range of 140 to <200° C. Said low resistivity can be in the range of, for example, only 6 to 10 μΩ·cm.

In the description and the claims the term "object temperature" is used. It means the substrate peak temperature reached during drying of a conductive metallization applied from the conductive metal composition of the invention onto the substrate.

The conductive metal composition of the invention includes 50 to 94 wt %, or, in an embodiment, 60 to 90 wt % of silver particles, based on total conductive metal composition. The silver particles may be uncoated or at least partially coated with a surfactant. The surfactant may be selected from, but is not limited to, stearic acid, palmitic acid, lauric acid, oleic acid, capric acid, myristic acid and linolic acid and salts thereof, for example, ammonium, sodium or potassium salts.

The silver particles have an average particle size in the range of 40 to 450 nm, or, in an embodiment, 80 to 450 nm. If the average particle size of the silver particles is above 450 nm, the desired low resistivity of a conductive metallization applied from the conductive metal composition on a substrate and dried under mild drying conditions at a low object temperature in the range of 140 to <200° C. cannot be achieved.

The silver particles exhibit an aspect ratio in the range of 3 to 1:1, or, in an embodiment, 2 to 1:1. Said aspect ratio shall express that the silver particles have a true spherical or essentially spherical shape as opposed to irregular silver particles like, for example, acicular silver particles (silver needles) or silver flakes (silver platelets). The individual silver particles when looked at under an electron microscope have a ball like or near-to-ball like shape, i.e., they may be perfectly round or almost round, elliptical or they may have an ovoid shape. The silver particles' surface may be uniform and it may exhibit a smooth radius of curvature.

Silver particles having an average particle size in the range of 40 to 450 nm and having an aspect ratio in the range of 3 to 1:1 are commercially available. Examples of such commercially available silver particles are the products 7000-24 and 7000-35 from Ferro.

The conductive metal composition of the invention includes 1 to 4 wt % or, in an embodiment, 2 to 3.5 wt % of a thermoplastic polyester resin as a binder. The 1 to 4 wt % mean polyester resin solid, based on total conductive metal composition.

The thermoplastic polyester resin has a weight-average molar mass determined by gel permeation chromatography (GPC; divinylbenzene-cross-linked polystyrene as the immobile phase, tetrahydrofuran as the liquid phase, polystyrene standards) of 10000 to 150000 or, in an embodiment, of 15000 to 60000. If the weight-average molar mass is below 10000 the adhesion of dried conductive metallizations applied from the conductive metal composition of the invention weakens; if it exceeds 150000, the electrical conductivity of the applied and dried conductive metal composition of the invention may suffer.

The thermoplastic polyester resin may be free from or may have functional groups like hydroxyl and/or carboxyl groups. Accordingly, its hydroxyl number may be in the range of, for example, 0 to 12 mg of KOH/g and its carboxyl number may be in the range of, for example, 0 to 5 mg of KOH/g.

In an embodiment, the thermoplastic polyester resin is a linear polyester resin.

The production of thermoplastic polyester resins is known to the person skilled in the art. Thermoplastic polyester resins may in particular be produced by reacting one or more carboxyl components comprising one or more polycarboxylic acids with one or more hydroxyl components comprising one or more polyols. In addition to one or more polycarboxylic acids the carboxyl components may also comprise monocarboxylic acids and hydroxycarboxylic acids. Instead of polycarboxylic acids their anhydrides can also be used.

Examples of polycarboxylic acids suitable for the production of the thermoplastic polyester resin can include trimellitic acid, phthalic acid, isophthalic acid, terephthalic acid, tetrahydrophthalic acid, hexahydrophthalic acid, 1,3- and 1,4-cyclohexane dicarboxylic acid, succinic acid, adipic acid, sebacic acid, azelaic acid, dodecane dicarboxylic acid, maleic acid, fumaric acid, or a combination thereof.

Examples of monocarboxylic acids suitable for the production of the thermoplastic polyester resin can include benzoic acid, butyl benzoic acid, 2-ethylhexanoic acid, isononanoic acid, coconut fatty acid, decanoic acid, dodecanoic acid, tetradecanoic acid, stearic acid, palmitic acid or a combination thereof.

Examples of hydroxycarboxylic acids suitable for the production of the thermoplastic polyester resin can include 12-hydroxystearic acid, 6-hydroxyhexanoic acid, dimethylolpropionic acid or a combination thereof.

In addition to one or more polyols the hydroxyl components may also comprise monoalcohols.

Examples of polyols suitable for the production of the thermoplastic polyester resin can include polyols like bisphenol A, ethylene glycol, the isomeric propane- and butanediols, 1,5-pentanediol, 1,6-hexanedial, 1,10-decanediol, 1,12-dodecanediol, 1,4-cyclohexanedimethanol, hydrogenated bisphenol A, neopentyl glycol, butylethylpropanediol, the isomeric cyclohexanediols, the isomeric cyclohexanedimethanols, tricyclodecanedimethanol, but also polyols with more than two hydroxyl groups like glycerol, trimethylolpropane, trimethylolethane, pentaerythritol, dipentaerythritol or a combination thereof.

Examples of monoalcohols suitable for the production of the thermoplastic polyester resin can include hexanol, dodecanol, cyclohexanol or a combination thereof.

The person skilled in the art selects the nature and proportion of the one or more carboxyl components and the one or more hydroxyl components for the production of the thermoplastic polyester resin in such a manner that a thermoplastic polyester resin with the above characteristics regarding hydroxyl and/or carboxyl content and weight-average molar mass is obtained.

The thermoplastic polyester resin may be prepared by polycondensation of the one or more carboxyl components and the one or more hydroxyl components. Polycondensation may be carried out by the conventional methods known to the skilled person, for example, in the presence of conventional esterification catalysts and at elevated temperatures from, e.g. 120° to 200° C., for example, in the melt. Optionally, entrainers, such as, e.g. xylene, may also be used. The one or more carboxyl components and the one or more hydroxyl components may be reacted together to form the thermoplastic polyester resin in a multi-step or one-step synthesis process. The one or more carboxyl components and the one or more hydroxyl components may be charged at the same time and heated together, optionally, melted and polycondensed with one another to form the thermoplastic polyester resin.

Thermoplastic polyester resins having a weight-average molar mass in the range of 10000 to 150000 are commercially available. Examples of such commercially available thermoplastic polyester resins are the products Vitel® 2200B from Bostik and Dynapol® L 952 from Evonik.

The conductive metal composition of the invention includes 4 to 49 wt %, or, in an embodiment, 7 to 38 wt %, or, in another embodiment, 8 to 12 wt % of a diluent for the thermoplastic polyester resin. The diluent takes the form of one single organic solvent or a mixture of two or more organic solvents which dissolves/dissolve the thermoplastic polyester resin and which can evaporate from a metallization applied from the conductive metal composition of the invention while being dried under mild drying conditions at a low object temperature in the range of 140 to <200° C. Examples of suitable organic solvents can include alcohols like n-butanol; diols like ethylene glycol, propylene glycol, diethylene glycol, triethylene glycol and hexylene glycol; ether alcohols like butoxyethanol, propoxypropanol and butyldiglycol; ethers like ethylene glycol di-C1-C6-alkyl ethers, propylene glycol di-C1-C6-alkyl ethers, diethylene glycol di-C1-C6-alkyl ethers, dipropylene glycol di-C1-C6-alkyl ethers and tetrahydrofuran; ketones like acetone, methyl ethyl ketone, methyl propyl ketone, methyl isobutyl ketone, methyl amyl ketone, methyl isoamyl ketone, diethyl ketone, diisobutyl ketone, cyclohexanone, isophorone, 2,4-pentanedione and methoxy hexanone; esters or ether esters like ethyl ethoxypropionate, methyl glycol acetate, ethyl glycol acetate, butyl glycol acetate, butyl diglycol acetate, methoxypropyl acetate, ethoxypropyl acetate, methoxybutyl acetate, methyl acetate, ethyl acetate, propyl acetate, butyl acetate, isobutyl acetate, the pentyl acetate isomers, hexyl actetate, heptyl acetate, ethylhexyl acetate, methyl propionate, ethyl propionate, propyl propionate, butyl propionate, pentyl propionate, butyl butyrate, diethyl malonate, dimethyl adipate, dimethyl glutarate, dimethyl succinate, ethylene glycol diacetate, propylene glycol diacetate, dibutyl phthalate and dibutyl sebacate; terpenes, like alpha- or beta-terpineol; hydrocarbons like kerosene, or any combination thereof.

The conductive metal composition of the invention may or may not include at least one additive. Accordingly, the proportion of the at least one additive is in the range of, for example, 0 to <1 wt %, based on total conductive metal composition. Examples of additives which may be included in the conductive metal composition of the invention can include defoamers, leveling agents and rheology control agents.

In an embodiment, the metal composition of the invention consists of 50 to 94 wt % of silver particles having an average particle size in the range of 40 to 450 nm and having an aspect ratio of 3 to 1:1, 1 to 4 wt % of a thermoplastic polyester resin having a weight-average molar mass of 10000 to 150000, 4 to 49 wt % of a diluent for the thermoplastic polyester resin, and 0 to <1 wt % of at least one additive, wherein the sum of the wt % totals 100 wt %.

The conductive metal composition of the invention is a viscous composition, which may be prepared by mechanically mixing the silver particles with the thermoplastic polyester resin, the diluent and the optional one or more additives. In an embodiment, it may be prepared by mechanically mixing the silver particles with a solution of the thermoplastic polyester resin in the diluent. In an embodiment, the manufacturing method power mixing, a dispersion technique that is equivalent to the traditional roll milling, may be used; roll milling or other mixing technique can also be used. The possible one or more additives may be added at various stages of the mixing process, for example, before and/or during the mixing process.

The conductive metal composition of the invention may be used in the production of conductive metallizations on substrates. In an embodiment, the conductive metallization may serve as a conductive track. In another embodiment it may serve as a collector electrode.

Therefore the invention relates also to such production process and to substrates provided with conductive metallizations made by said production process. Said production process includes the steps:

(1) providing a substrate,
(2) applying the conductive metal composition of the invention on the substrate, and
(3) drying the applied conductive metal composition to form a conductive metallization on the substrate.

In step (1) of the process of the invention a substrate is provided. The substrate may be comprised of one or more than one material. The term "material" used herein in this context refers primarily to the or one or more of the bulk materials the substrate is comprised of. However, if the substrate is comprised of more than one materials, the term "material" shall not be misunderstood to exclude materials present as a layer. Rather, substrates comprised of more than one material include substrates comprised of more than one bulk material without any thin layers as well as substrates comprised of one or more than one bulk material and provided with one or more than one thin layer. Examples of said layers include dielectric (electrically insulating) layers and active layers.

Examples of dielectric layers include layers of inorganic dielectric materials like silicon dioxide, zirconia-based materials, alumina, silicon nitride, aluminum nitride and hafnium oxide; and organic dielectric materials, e.g. fluorinated polymers like PTFE, polyesters and polyimides.

The term "active layer" is used in the description and the claims. It shall mean a layer selected from the group including photoactive layers, light-emissive layers, semiconductive layers and non-metallic conductive layers. In an embodiment, it shall mean layers selected from the group consisting of photoactive layers, light-emissive layers, semiconductive layers and non-metallic conductive layers.

For the purpose of the present disclosure, the term "photoactive" used herein shall refer to the property of converting radiant energy (e.g., light) into electric energy.

Examples of photoactive layers include layers based on or including materials like copper indium gallium diselenide, cadmium telluride, cadmium sulphide, copper zinc tin sulphide, amorphous silicon, organic photoactive compounds or dye-sensitized photoactive compositions.

Examples of light-emissive layers include layers based on or including materials like poly(p-phenylene vinylene), tris (8-hydroxyguiholinato)aluminum or polyfluorene (derivatives).

Examples of semiconductive layers include layers based on or including materials like copper indium gallium diselenide, cadmium telluride, cadmium sulphide, copper zinc tin sulphide, amorphous silicon or organic semiconductive compounds.

Examples of non-metallic conductive layers include layers based on or including organic conductive materials like polyaniline, PEDOT:PSS (poly-3,4-ethylenedioxythiophene polystyrenesulfonate), polythiophene or polydiacetylene; or based on or including transparent conductive materials like indium tin oxide (ITO), aluminum-doped zinc oxide, fluorine-doped tin oxide, graphene or carbon nanotubes.

In an embodiment, the substrate is a temperature-sensitive substrate. This means that the material or one or more of the materials the substrate is comprised of are temperature-sensitive. For the avoidance of doubt, this includes such cases, where the substrate includes at least one of the aforementioned layers wherein the layer or one, more or all layers are temperature-sensitive.

The term "temperature-sensitive" as opposed to "temperature-resistant" is used in the description and the claims with reference to a substrate, a substrate material (=the or one of the bulk materials a substrate is comprised of) or a layer of a substrate and its behavior when exposed to heat. Hence, "temperature-sensitive" is used with reference to a substrate, a substrate material or a layer of a substrate which does not withstand a high object temperature of $\geq 400°$ C. or, in other words, which undergoes an unwanted chemical and/or physical alteration at a high object temperature of $\geq 400°$ C. Examples of such unwanted alteration phenomena include degradation, decomposition, chemical conversion, oxidation, phase transition, melting, change of structure, deformation and combinations thereof. Object temperatures of $\geq 400°$ C. occur for example during a conventional firing process as is typically used in the manufacture of metallizations applied from metal pastes which contain glass binders.

Accordingly, the term "temperature-resistant" is used herein with reference to a substrate, a substrate material or a layer of a substrate which withstands an object temperature of $\geq 400°$ C.

A first group of examples of substrate materials includes organic polymers. Organic polymers are typically temperature-sensitive. Examples of suitable organic polymer materials include PET (polyethylene terephthalate), PEN (polyethylene napthalate), PP (polypropylene), PC (polycarbonate) and polyimide.

A second group of examples of substrate materials includes materials other than an organic polymer, in particular, inorganic non-metallic materials and metals. Inorganic non-metallic materials and metals are typically temperature-resistant. Examples of inorganic non-metallic materials include inorganic semiconductor materials like monocrystalline silicon, polycrystalline silicon, silicon carbide; and inorganic dielectric materials like glass, quartz, zirconia-based materials, alumina, silicon nitride and aluminum nitride. Examples of metals include aluminum, copper and steel.

The substrates may take various forms, examples of which include the form of a film, the form of a foil, the form of a sheet, the form of a panel and the form of a wafer.

In step (2) of the process of the invention the conductive metal composition is applied on the substrate. In case the substrate is provided with at least one of the aforementioned layers, the conductive metal composition may be applied on such layer. The conductive metal composition may be applied to a dry film thickness of, for example, 0.1 to 100 µm. The method of conductive metal composition application may be printing, for example, flexographic printing, gravure printing, ink-jet printing, offset printing, screen printing, nozzle/extrusion printing, aerosol jet printing, or it may be pen-writing. The variety of application methods enables the conductive metal composition to be applied to cover the entire surface or only one or more portions of the substrate. It is possible for example to apply the conductive metal composition in a pattern, wherein the pattern may include fine structures like dots or thin lines with a dry line width as low as, for example, 10 or 20 µm.

In step (3) of the process of the invention the applied conductive metal composition is dried to form a conductive metallization on the substrate. The primary target of this drying step is the removal of organic solvent; however, the drying step may also support the densification of the metallization matrix. Drying may be performed, for example, for a period of 1 to 60 minutes at an object temperature in the range of 100 to 240° C., or, in an embodiment, 130 to 200° C., or, in another embodiment, 140 to <200° C. The skilled person will select the object temperature considering the thermal stability of the polyester resin constituent of the metal composition and of the substrate provided in step (1).

Drying can be carried out making use of, for example, a belt, rotary or stationary dryer, or a box oven. The heat may be applied by convection and/or making use of IR (infrared) radiation. The drying may be supported by air blowing.

Alternatively, drying may be performed using a method which induces a higher local temperature in the metallization than in the substrate as a whole, i.e. in such case the object temperature of the substrate may be as low as room temperature during drying. Examples of such drying methods include photonic heating (heating via absorption of high-intensity light), microwave heating and inductive heating.

The metallized substrate obtained after conclusion of step (3) of the process of the invention may represent an electronic device. However, it is also possible that it forms only a part of or an intermediate in the production of an electronic device.

Examples of said electronic devices include RFID (radio frequency identification) devices; photovoltaic devices, in particular solar cells; light-emissive devices, for example, displays, LEDs (light emitting diodes), OLEDs (organic light emitting diodes); smart packaging devices; and touchscreen devices. In case the metallized substrate forms only said part or intermediate it is further processed. One example of said further processing may be encapsulation of the metallized substrate to protect it from environmental impact. Another example of said further processing may be providing the dried metallization with one or more of the aforementioned dielectric or active layers, wherein in case of an active layer direct or indirect electrical contact is made between metallization and active layer. A still further example of said further processing is electroplating or light-induced electroplating of the metallization which then serves as a seed metallization.

EXAMPLES

Examples 1-11

(Production and Testing of Conductive Metal Compositions, General Procedure):

A thermoplastic polyester resin was dissolved in 9.8 pbm (parts by mass) of dibasic ester solvent DBE-3 from Invista (mixture containing 89 wt. % of dimethyl adipate and 10 wt. % of dimethyl glutarate) by heating up to 90° C. to form a viscous liquid medium. To this medium a silver powder was added and the resulting material was mixed using a gyratory mixer. In those cases where the mixture of polyester resin, silver powder and DBE-3 did not total 100 pbm the balance was made up by addition of DBE-3. Then, using a triple roll mill, the mixture was roll milled to achieve a well dispersed paste (determined by use of a Hegman gauge), This paste was screen printed as a line through a screen opening 720 µm wide onto a clean float glass substrate and subsequently dried in a static oven preset at 190° C. for one hour.

The electrical resistance of the dried print was measured by using a 4-wire probe, from which the resistivity of the print was calculated (in µΩ·cm).

Adhesion was checked by using Scotch® 600 Cellophane tape; the tape was applied to the printed line and pulled at 180° to the print direction. Goodness of adhesion was determined by the amount of material removed by the tape (no removal=OK; removal or partial removal=not OK).

Pencil hardness was tested according to ISO 15184.

Table 1 summarizes the composition of the compositions made and the test results obtained.

TABLE 1

| Example | Silver powder pbm/type/ d50 (µm) | Polyester pbm/type | Adhesion | Pencil Hardness | Resistivity (µΩ · cm) |
|---|---|---|---|---|---|
| 1 | 87/spherical/0.3 | 3.2/A | OK | 3H | 7.2 |
| 2 | 87/spherical/0.1 | 3.2/A | OK | 3H | 7.0 |
| 3* | 87/spherical/0.45 | 3.2/A | OK | 3H | 10.5 |
| 4* | 86/spherical/2.1 | 3.2/A | OK | B | 375.5 |
| 5* | 86/flake/1.7 | 3.2/A | OK | 4B | 24.3 |
| 6* | 84/flake/1.7 | 5.3/A | OK | B | 19.5 |
| 7* | 84/spherical/0.3 | 5.3/A | OK | 3H | 12.0 |
| 8* | 86/flake/4.5 | 3.2/A | OK | 3B | 17.8 |
| 9* | 84/flake/4.5 | 5.3/A | OK | B | 18.5 |

TABLE 1-continued

| Example | Silver powder pbm/type/ d50 (µm) | Polyester pbm/type | Adhesion | Pencil Hardness | Resistivity (µΩ · cm) |
|---|---|---|---|---|---|
| 10 | 87/spherical/0.3 | 3.2/B | OK | 4H | 8.0 |
| 11* | 87/spherical/0.3 | 3.2/C | not OK | 2H | 13.3 |

*comparative example;
polyester A: linear thermoplastic polyester having a weight-average molar mass of 47500, a hydroxyl number of 3-6 mg KOH/g and an acid number of 1-3 mg KOH/g;
polyester B: linear thermoplastic polyester having a weight-average molar mass of 18000, a hydroxyl number of 7.5 mg KOH/g and an acid number of 1.4 mg KOH/g;
polyester C: linear thermoplastic polyester having a weight-average molar mass of 4000, a hydroxyl number of 28 mg KOH/g and an acid number of 1.4 mg KOH/g.

What is claimed is:

1. A conductive metal composition comprising a conductive component consisting of 50 to 94 wt % of silver particles having an average particle size in the range of 40 to less than 450 nm and having an aspect ratio of 3 to 1:1, 1 to 4 wt % of a thermoplastic polyester resin having a weight-average molar mass of 10000 to 150000, and 4 to 49 wt % of a diluent for the thermoplastic polyester resin.

2. The conductive metal composition of claim 1, wherein the silver particles are 60 to 90 wt % of the composition.

3. The conductive metal composition of claim 1, wherein the thermoplastic polyester resin is 2 to 3.5 wt % of the composition.

4. The conductive metal composition of claim 1, wherein the diluent is 7 to 38 wt % of the composition.

5. The conductive metal composition of claim comprising one or more additives.

6. The conductive metal composition of claim 1 consisting of 50 to 94 wt % of silver particles having an average particle size in the range of 40 to less than 450 nm and having an aspect ratio of 3 to 1:1, 1 to 4 wt % of a thermoplastic polyester resin having a weight-average molar mass of 10000 to 150000, 4 to 49 wt % of a diluent for the thermoplastic polyester resin, and 0 to <1 wt % of at least one additive, wherein the sum of the wt % totals 100 wt %.

7. The conductive metal composition of claim 1, wherein the thermoplastic polyester resin is a linear polyester resin.

8. A process for the production of a conductive metallization on a substrate, comprising the steps:
   (1) providing a substrate,
   (2) applying the conductive metal composition of claim 1 on the substrate, and
   (3) drying the applied conductive metal composition to form a conductive metallization on the substrate.

9. The process of claim 8, wherein the substrate comprises one or more materials.

10. The process of claim 9, wherein the substrate comprises two or more materials, wherein one or more of the materials is selected from the group consisting of: dielectric layers and active layers.

11. The process of claim 10, wherein the active layers is selected from the group consisting of: photoactive layer, light-emissive layer, semiconductive layer and non-metallic conductive layer.

12. The process of claim 9, wherein the one or one or more of the more than one materials is a bulk material selected from the group consisting of: organic polymers, inorganic non-metallic materials and metals.

13. The process of claim 8, wherein the conductive metal composition is applied by printing or pen-writing.

14. The process of claim 8, wherein the drying is performed for a period of 1 to 60 minutes at an object temperature in the range of 100 to 240° C.

15. The process of claim 8, wherein the drying is performed by photonic heating, microwave heating or inductive heating.

* * * * *